(12) United States Patent
Wang

(10) Patent No.: US 8,598,661 B2
(45) Date of Patent: Dec. 3, 2013

(54) EPITAXIAL PROCESS FOR FORMING SEMICONDUCTOR DEVICES

(71) Applicant: Taiwan Semiconductor Manfacturing Co., Ltd., Hsin-Chu (TW)

(72) Inventor: Shiang-Bau Wang, Pingzchen (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/744,559

(22) Filed: Jan. 18, 2013

(65) Prior Publication Data

US 2013/0126982 A1    May 23, 2013

Related U.S. Application Data

(62) Division of application No. 13/181,575, filed on Jul. 13, 2011, now Pat. No. 8,383,485.

(51) Int. Cl.
*H01L 21/02* (2006.01)
*H01L 27/088* (2006.01)

(52) U.S. Cl.
USPC .......................................... 257/346; 257/401

(58) Field of Classification Search
USPC ................................. 257/346, 401
See application file for complete search history.

(56) References Cited

U.S. PATENT DOCUMENTS

| | | |
|---|---|---|
| 4,978,626 A | 12/1990 | Poon et al. |
| 5,780,343 A | 7/1998 | Bashir |
| 5,811,315 A | 9/1998 | Yindeepol et al. |
| 5,858,847 A | 1/1999 | Zhou et al. |
| 5,914,523 A | 6/1999 | Bashir et al. |
| 6,506,661 B1 | 1/2003 | Chang et al. |
| 6,531,374 B2 | 3/2003 | Lee et al. |
| 6,818,533 B2 | 11/2004 | Chen et al. |
| 7,067,387 B2 | 6/2006 | Lin |
| 7,141,478 B2 | 11/2006 | Speyer |
| 7,592,619 B2 | 9/2009 | Tsai et al. |
| 7,803,690 B2 | 9/2010 | Yu et al. |
| 7,919,335 B2 | 4/2011 | Xiao et al. |
| 8,216,906 B2 | 7/2012 | Tsai et al. |
| 8,236,659 B2 | 8/2012 | Tsai et al. |
| 2006/0189053 A1* | 8/2006 | Wang et al. .................. 438/197 |
| 2006/0199321 A1* | 9/2006 | Lo et al. ...................... 438/197 |
| 2006/0228850 A1* | 10/2006 | Tsai et al. .................... 438/219 |
| 2008/0064153 A1* | 3/2008 | Qiang Lo et al. ............ 438/174 |
| 2009/0108378 A1* | 4/2009 | Zhu et al. ..................... 257/412 |
| 2009/0224320 A1* | 9/2009 | Chan et al. ................... 257/347 |
| 2009/0261391 A1* | 10/2009 | Kavalieros et al. .......... 257/288 |
| 2010/0035400 A1* | 2/2010 | Zhu et al. ..................... 438/300 |
| 2010/0102400 A1* | 4/2010 | Sell ................................ 257/411 |
| 2010/0216277 A1 | 8/2010 | Fiorenza et al. |
| 2010/0227466 A1* | 9/2010 | Liao .............................. 438/591 |
| 2010/0304563 A1* | 12/2010 | Chan et al. ................... 438/655 |

(Continued)

*Primary Examiner* — Ngan Ngo
(74) *Attorney, Agent, or Firm* — Duane Morris LLP

(57) ABSTRACT

A method for forming a semiconductor device such as a MOSFET. The method includes forming gate electrode pillars on a silicon substrate via material deposition and etching. Following the etching step to define the pillars, an epitaxial silicon film is grown on the substrate between the pillars prior to forming recesses in the substrate for the source/drain regions of the transistor. The epitaxial silicon film compensates for substrate material that may be lost during formation of the gate electrode pillars, thereby producing source/drain recesses having a configuration amenable to be filled uniformly with silicon for later forming the source/drain regions in the substrate.

13 Claims, 5 Drawing Sheets

(56) References Cited

U.S. PATENT DOCUMENTS

| | | |
|---|---|---|
| 2010/0320503 A1* | 12/2010 | Chong et al. .................. 257/190 |
| 2011/0108894 A1* | 5/2011 | Sung et al. .................... 257/288 |
| 2011/0121393 A1* | 5/2011 | Chau et al. .................... 257/347 |
| 2011/0147810 A1* | 6/2011 | Hsu et al. ...................... 257/288 |
| 2011/0165739 A1* | 7/2011 | Majumdar et al. ............ 438/154 |
| 2011/0183486 A1* | 7/2011 | Chan et al. .................... 438/300 |
| 2011/0186914 A1* | 8/2011 | Cheng et al. .................. 257/288 |
| 2011/0201166 A1 | 8/2011 | Chung et al. |
| 2011/0291189 A1* | 12/2011 | Cheng et al. .................. 257/347 |
| 2011/0291200 A1* | 12/2011 | Keshavarzi et al. ........... 257/369 |
| 2011/0291202 A1* | 12/2011 | Cheng et al. .................. 257/408 |
| 2011/0298049 A1 | 12/2011 | Liang et al. |
| 2011/0312145 A1* | 12/2011 | Tsai et al. ..................... 438/300 |
| 2012/0001254 A1* | 1/2012 | Kronholz et al. .............. 257/327 |
| 2012/0043624 A1* | 2/2012 | Liang et al. ................... 257/410 |
| 2012/0049250 A1 | 3/2012 | Park et al. |
| 2012/0061759 A1* | 3/2012 | Cheng et al. .................. 257/347 |
| 2012/0068273 A1* | 3/2012 | Fischer et al. ................. 257/369 |
| 2012/0074503 A1* | 3/2012 | Utomo et al. .................. 257/369 |
| 2012/0091539 A1* | 4/2012 | Fan et al. ....................... 257/401 |
| 2012/0094448 A1 | 4/2012 | Yeh et al. |
| 2012/0161105 A1* | 6/2012 | Rachmady et al. ............. 257/19 |
| 2012/0181625 A1 | 7/2012 | Kwok et al. |
| 2012/0187505 A1* | 7/2012 | Guo et al. ...................... 257/401 |
| 2012/0193710 A1* | 8/2012 | Cheng et al. .................. 257/337 |
| 2012/0205715 A1 | 8/2012 | Kwok et al. |
| 2012/0205729 A1* | 8/2012 | Chau et al. .................... 257/288 |
| 2012/0217553 A1* | 8/2012 | Luo et al. ...................... 257/288 |
| 2012/0223372 A1* | 9/2012 | Alptekin et al. ............... 257/288 |
| 2012/0241868 A1 | 9/2012 | Tsai et al. |
| 2012/0261718 A1* | 10/2012 | Sosa Cortes et al. .......... 257/192 |
| 2012/0273798 A1* | 11/2012 | Alptekin et al. ................. 257/77 |
| 2012/0292700 A1* | 11/2012 | Khakifirooz et al. .......... 257/347 |
| 2012/0302013 A1* | 11/2012 | Houston ........................ 438/128 |
| 2012/0319203 A1* | 12/2012 | Cheng et al. .................. 257/346 |
| 2012/0326241 A1* | 12/2012 | Haran et al. ................... 257/401 |
| 2013/0026538 A1* | 1/2013 | Liao et al. ..................... 257/190 |

* cited by examiner

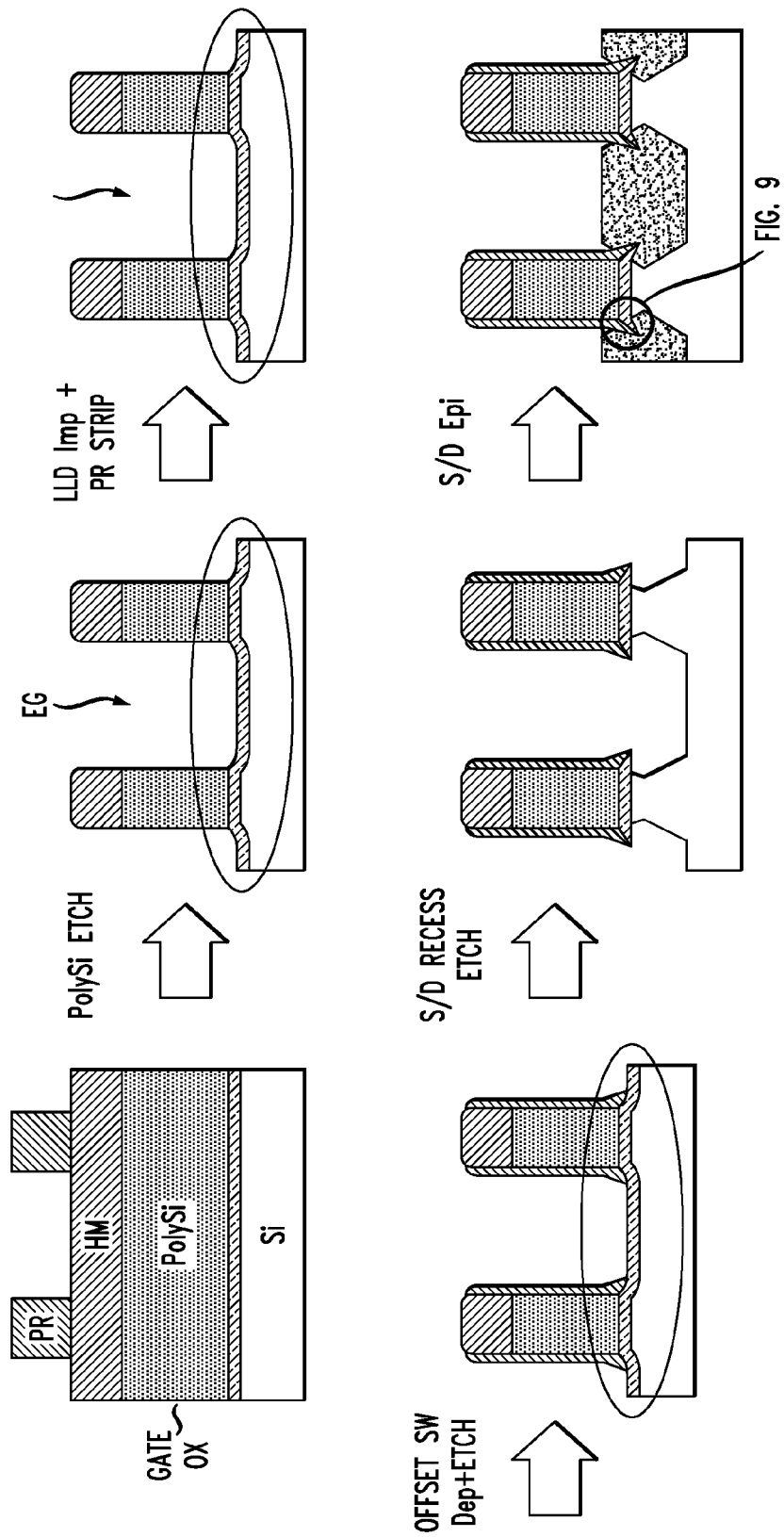

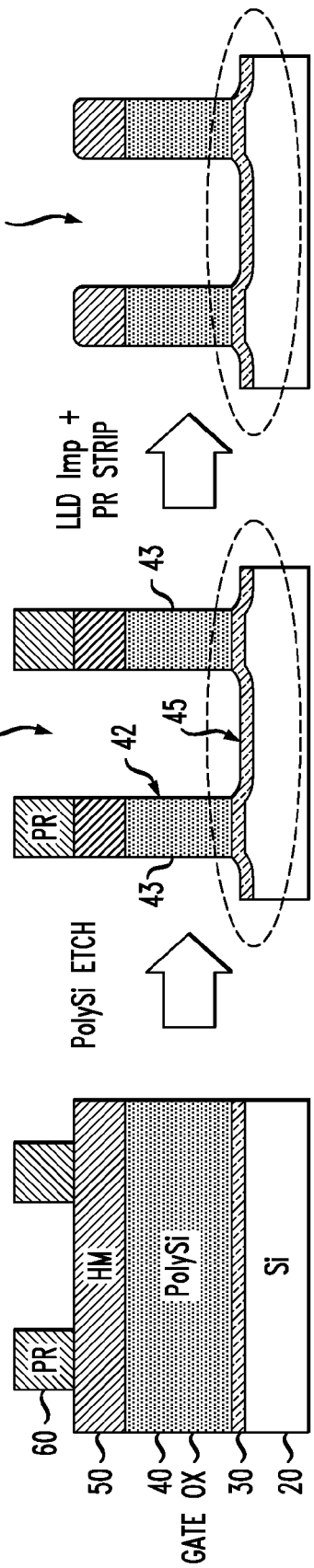

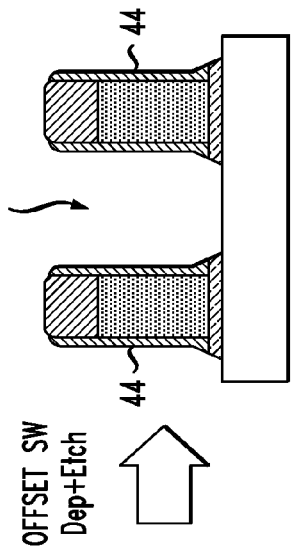
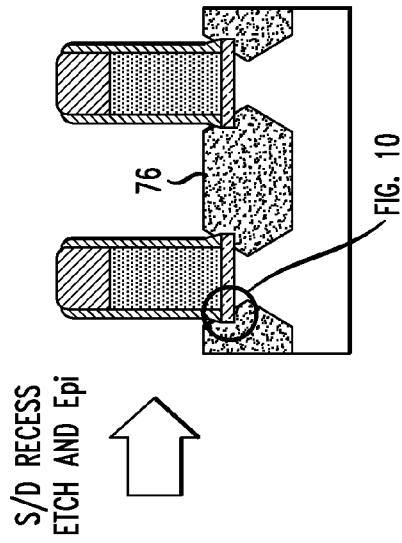
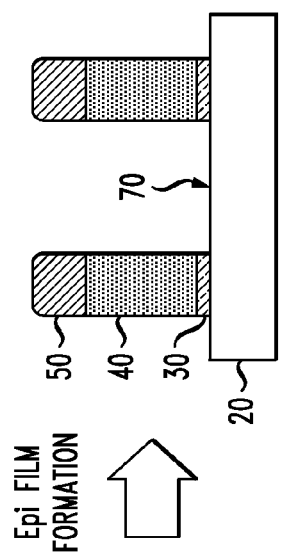
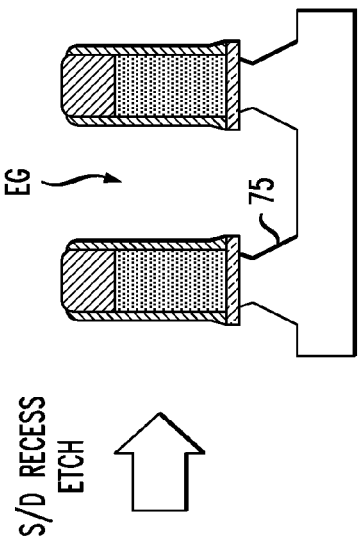

EPITAXIAL PROCESS FOR FORMING SEMICONDUCTOR DEVICES

CROSS-REFERENCE TO RELATED APPLICATIONS

This application is a divisional of co-pending U.S. patent application Ser. No. 13/181,575, filed on Jul. 13, 2011, the contents of which is hereby incorporated by reference as if set forth in its entirety.

FIELD OF THE INVENTION

The present invention generally relates to semiconductors, and more particularly to a method for fabricating a semiconductor device such as a MOSFET.

BACKGROUND

Gated semiconductor devices such as metal oxide semiconductor field-effect transistors (MOSFETs) are commonly formed in active isolated regions of an IC chip. In MOSFETs, dopant implanted source and drain regions (S/D) are formed in a silicon substrate with corresponding S/D terminals. MOSFETs further include raised or elevated conductive gate layer pillars on the silicon substrate for forming gate electrodes. The gate layer is comprised of conductive material such as doped or undoped polysilicon and is electrically isolated from the silicon substrate by a suitable dielectric gate insulator or oxide layer such as silicon dioxide. When a sufficiently high gate voltage is applied, an electrically conductive inversion layer or channel forms at the interface between the gate oxide layer and silicon substrate. The conductive channel extends between the source and the drain, whereby current flows through the channel when a voltage is applied between the source and drain.

The source and drain regions may be formed in the silicon substrate by dopant ion implantation with P-type or N-type impurities as is well known in the art to form NMOS or PMOS transistors, respectively.

These foregoing MOSFET devices, including the raised gate pillars, are generally produced using a combination of known photolithography, material deposition, and material removal (e.g. etching, ashing, wet stripping, etc.) fabrication steps. Fabrication processes for forming semiconductor devices such as MOSFETs may also generally include growing or forming one or more pure monocrystalline epitaxial silicon layers on the silicon substrate as is well known in the art. Epitaxial silicon layers beneficially forms uniform silicon layers of predictable electrical characteristics, thereby enhancing the integrity and performance of the resulting semiconductor device formed on the substrate.

As the size of IC chips continues to decrease, so does the size of semiconductor devices such as MOSFETs. This creates new chip fabrication challenges for producing MOSFETs of ever decreasing dimensions that remain free of defects which may degrade device performance and therefore increase chip rejection rates. The challenge of producing defect-free semiconductor devices is increasingly acute in the N20 technology node (20 nm process) and beyond.

One problem facing N20 node fabrication of MOSFET devices is silicon loss. FIG. 1 illustrates a conventional MOSFET device fabrication formation process used to make a lightly doped drain (LDD) MOSFET transistor which may experience a silicon loss defect. In LDD structures, source and drain regions near the conductive channel are less heavily doped (e.g. N-) than regions of the source and drain farther away from the channel. The lower doping near the gate electrode minimizes electric field effects near the drain, thereby improving the speed and reliability of the MOSFET transistor.

As shown in FIG. 1, the steps may sequentially include polysilicon layer etching to form gate electrode pillars, LDD ion implantation (shown in dashed lines) and subsequent photoresist (PR) stripping, offset sidewall (SW) spacer deposition and subsequent etching, source/drain (S/D) recess etching, and S/D epitaxial silicon deposition. During the various foregoing material etching and stripping operations, a reduction in the silicon substrate and gate oxide material occurs as a side effect as shown by the shallow concave depressions between the raised gate pillars). This may result in a profile wherein concave cavities or recesses are formed beneath the raised source and drain pillars between the gate oxide and substrate (see S/D Recess Etch step). During the subsequent epitaxial silicon deposition process shown in the last image of FIG. 1 (labeled S/D Epi), the silicon may not always completely fill the concave recess resulting in an unwanted void at the very inside corner of the concave recess as shown in the enlarged detail. These voids are an undesirable defect because if large enough, they may adversely affect the performance of the MOS transistor.

An improved process for producing a semiconductor device is therefore desired.

SUMMARY

An improved fabrication process is provided for forming a semiconductor device such as a MOS transistor which is free of void defects at the gate electrode. The preferred process forms an epitaxial silicon layer prior to etching the source and drain region recesses in the silicon substrate. This reconstructs a planar or flat top surface on the substrate that compensates for any material loss occurring from the substrate as a byproduct of preceding etching and stripping process steps used to form the gate electrode pillars.

According to one embodiment, a method for fabricating a semiconductor transistor comprising the steps of: providing a silicon substrate; forming a gate oxide layer on the semiconductor substrate; forming a conductive gate layer on the gate oxide layer; forming a patterned photoresist layer above the gate layer, the patterned photoresist layer having a gate electrode pattern; performing a first etching step to form a plurality of recesses in the gate layer defining raised gate electrode pillars corresponding to the gate electrode pattern; implanting impurities through the recesses into the substrate to form lightly doped drain regions; forming an epitaxial silicon film on the substrate; and performing a second etching step after forming the epitaxial silicon film to form source and drain recesses in the substrate. The epitaxial silicon film may be removed during the second etching step.

BRIEF DESCRIPTION OF THE DRAWINGS

The features of the preferred embodiments will be described with reference to the following drawings where like elements are labeled similarly, and in which:

FIG. 1 shows sequential steps in a conventional prior art semiconductor device fabrication process;

FIGS. 2-8 show sequential steps in an exemplary semiconductor device fabrication process according to the present invention;

Figure 9:
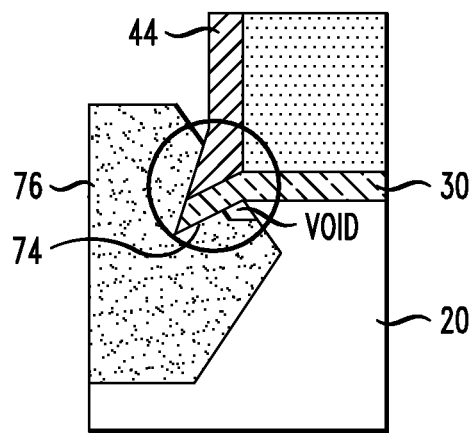
FIG. 9 is a detailed view of a gate electrode formed by the prior art process of FIG. 1.

All drawings are schematic and are not drawn to scale.

DETAILED DESCRIPTION OF THE PREFERRED EMBODIMENTS

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

One embodiment of an exemplary process for forming a semiconductor device such as without limitation a lightly doped drain (LDD) MOSFET is illustrated in FIGS. 2-8. These figures show sequential cross-sectional side views through the semiconductor structure during the MOSFET device formation process. In this non-limiting example, process steps occurring during the formation of a LLD MOSFET device are shown and described. However, it will be appreciated that the present process may be used to produce numerous other type transistors and semiconductor devices in which raised gate electrode pillars or other pillar structures may be formed. The semiconductor transistors to which the present process is applicable includes without limitation NMOS, PMOS, CMOS, and BiCMOS devices.

In one embodiment, the present process may include one or more epitaxial material layer formation steps. Advantageously, embodiments of the fabrication process according to the present invention produce a semiconductor device that is preferably free or essentially free of void defects as described in the Background of the Invention. This improves the integrity of the semiconductor device and reliability.

The epitaxial silicon layer formation processes ("epi processes") described herein can be performed in any suitable commercially-available epitaxy tool, such as the Epsilon Model Epitaxy Tool available from ASM International of the Netherlands, or other suitable commercially-available semiconductor fabrication tools.

Beginning now with initial reference to FIG. 2, a multilayer semiconductor device 10 may initially be created by sequentially forming (from the bottom upwards) an insulating dielectric gate oxide layer 30 on a conventional semiconductor silicon substrate 20, a conductive gate layer 40 thereon, and a hard mask layer 50 thereon. A patterned photoresist layer 60 is formed directly on the hard mask 50, which may be patterned using conventional photolithography techniques as well known to those skilled in the art. This may include in some embodiments using a mask or reticle supported above the photoresist layer, a light source to expose selective portions of the photoresist material, and conventional process steps for removing the developed portions of the photoresist as are well known to those in the art. The patterned photoresist layer 60 will be used to ultimately form the gate pillars on substrate 20 for the gate electrodes of a MOSFET transistor, as subsequently described herein. Accordingly, the photoresist pattern is configured and shaped to provide a gate electrode pattern.

Substrate 20 may be any suitable material conventionally used for fabricating MOSFET transistors. In one exemplary embodiment, a doped silicon substrate 20 may be provided that may be doped with suitable P-type or N-type impurities depending on whether an NMOS or PMOS device respectively is to be formed.

Gate oxide layer 30 may be any suitable thin film of insulating dielectric material commonly used in semiconductor fabrication processes for insulating layers. In one embodiment, the gate oxide layer 30 may be silicon dioxide which may be formed by thermally oxidizing the silicon in the substrate to form a thin insulating layer of silicon dioxide that is able to electrically isolate the transistor gate layer 40 from the drain and source regions in substrate 20. In representative examples, gate oxide layer 30 may have a typical thickness of about 10-100 A.

Conductive gate layer 40 may be any suitable conventional material used in semiconductor fabrication processes for transistor gates, such as without limitation a doped or undoped polysilicon layer, metal-containing layer, combinations thereof, or other conductive layer that is able to serve as a transistor gate for controlling the flow of electrons between the source and drain of the semiconductor device. In a preferred embodiment, gate layer 40 may be polysilicon. Gate layer 40 may be doped or undoped. If doped, a N/PMOS device may have a gate layer 40 doped with phosphorus (n-type dopant) or boron (p-type dopant). In representative examples, transistor gate layer 40 may have a thickness of about 300A-2000A.

In other possible embodiments, gate layer 40 may be a metal such as aluminum, highly doped silicon, refractory metals such as tungsten, a silicide (e.g. TiSi, MoSi, TaSi or WSi) or multiple layers of the foregoing materials.

Hard mask layer 50 may be any suitable conventional material used in semiconductor fabrication processes for hard marks, such as for example without limitation silicon nitride (SiN), (silicon carbide) SiC, and silicon oxynitride (SiON). Hard mask layer 50 protects the polysilicon layer during various etching and material removal steps. The hard mask 50 when patterned also provides a gate hard mask pattern for forming the gate electrode pillars as further described herein. In representative examples, hard mask layer 50 may have a thickness of about 50A-1500A Gate oxide layer 30, gate layer 40, hard mask layer 50 and photoresist layer 60 may be deposited in the formation of semiconductor 10 by any suitable conventional method as well known to those skilled in the art of semiconductor fabrication, such as for example without limitation PVD, PECVD, CVD, MVC, ECP, thermal oxidation processes, or others. It is well within the ambit of those skilled in the art to select an appropriate method for forming the foregoing material layers.

Following formation of the basic semiconductor structure resulting and shown in FIG. 2, the process steps involving the addition of epitaxial silicon films and layers for creating a semiconductor device such as a MOSFET without void defects will now be described.

After providing the semiconductor structure 10 shown in FIG. 2, a preferably anisotropic etching step is next performed as shown in FIG. 3 using a suitable etching gas (denoted "EG" in the figures) process to transfer the gate electrode pattern from photoresist layer 60 into the hard mask layer 50 and underlying transistor gate layer 40 resulting in the semiconductor structure shown in FIG. 3. This etching step produces recesses 41 in the semiconductor 10 which define the gate pillars 43 for creating the gate electrodes. Photoresist 60 is preferably more resistant to etching by the etching gas chemistry used and therefore protects the portions of gate layer 40 and hard mask 50 below which become the gate pillars 43. As shown, the anisotropic etching step produces and defines essentially vertical sidewalls 42 on the pillars 43, a portion of which will subsequently be covered by a sidewall spacer in subsequent process steps as further described herein.

In one possible embodiment, anisotropic dry gas plasma etching may be used. Dry etching is performed in an etcher machine by applying an electromagnetic energy source (such as RF) to a gas containing a suitable chemically reactive element that reacts with the material to be etched or removed. The gas plasma emits positively charged ions that strike and dissolve the dielectric material. By using a combination of hard masks and/or patterned photoresist layers above the conductive gate layer 40, various patterns of recesses or openings in the gate layer 40 or silicon substrate 20 can be made since the conductive gate material beneath the hard mask and photoresist will not substantially dissolve. Because the ions strike the gate material essentially perpendicular to its surface in anisotropic dry plasma etching, vertical recess profiles can be created with virtually no undercutting beneath the hard mask and photoresist Preferably, by relying on material etching selectivity, materials selected for both hard mask layer 50 and transistor gate layer 40 are preferably susceptible to etching by conventional anisotropic dry gas plasma etching chemistries, such as without limitation elemental fluorine F, $CF_4$, $C_4F_8$, $CHF_3$, $CH_2F_2$, or $C_5F_8$. Other suitable etching gas chemistries, however, may also be used. The type of etching gas used will depend on the material selected for both hard mask layer 50 and underlying gate layer 40, both of which preferably are susceptible to etching using the same etching gas so that a single etching chamber may be used. Preferably, photoresist 60 is resistant to the etching gas EG although some material loss may occur, but at a greatly reduced rate compared to hard mask 50 and gate layer 40.

The first etch step shown in FIG. 3 is preferably controlled to stop etching near the top interface surface of gate oxide layer 30 or slightly into that layer. In one possible embodiment, this may be achieved by selecting an appropriate operating mode of the commercially-available etching tool that may be used in the process. The etching tool may be set to "end point detected mode." When the etching tool detects a different signal being received from gate oxide layer 30 (shown in FIG. 3) in the etching process, the system will be stopped to prevent over-etching.

Although the etching process in FIG. 3 is preferably carefully controlled and stopped when nearing the top of now exposed interface surface of gate layer 30, some over-etching may nevertheless occur resulting in undesired material loss from gate oxide layer 30 and underlying silicon substrate 20 that may form concave depressions 45 in recesses 41 between gate electrode pillars 43.

In the next step, referring to FIG. 4, in one embodiment LDD regions 48 (shown dashed) may be formed in silicon substrate 20 via implanting impurities using conventional ion implantation with a suitable dopant containing, for example, N-type or P-type impurities as will be well known to those skilled in the art. P-type regions may be formed by the use of P-type dopants such as boron (B) or other elements of group II or III of the periodic table. N-type regions may be formed by use of N-type dopants such as phosphorus (P), arsenic (As) or other elements of group V or VI of the periodic table.

With continuing reference to FIG. 4, photoresist layer 60 is then stripped after forming LLD regions 48 by any suitable technique commonly used in the art including gaseous or wet etching methods. In some embodiments, without limitation, photoresist layer 60 may be stripped using a dry gas plasma containing for example H2, N2, O2, or CF4. Alternatively a wet photoresist stripping process may be used, such as without limitation SPM (high density and high temperature Sulfuric acid (H2SO4) and hydrogen peroxide (H2O2) solution). The photoresist stripping does not substantially effect hard mask layer 50 and underlying transistor gate layer 40 which preferably are both made of materials selected to be resistant to material loss/reduction by the photoresist stripping process selected. However, the oxidant in the foregoing stripping processes will further oxidize substrate 20 silicon and cause further silicon loss. The photoresist stripping processes, therefore, may result in yet a second instance of further silicon loss and deepening of concave depressions 45 from exposed gate oxide layer 30 and silicon substrate 20 between gate electrode pillars 43.

Following the LDD ion implantation and photoresist stripping processes, the semiconductor structure generally appears as shown in FIG. 4.

It will be appreciated that in some alternative processes, hard mask layer 50 may first be patterned using patterned photoresist 60 as shown in FIG. 2, then prior to the etching step shown in FIG. 3, the photoresist may be stripped and then the patterned hard mask having the same configuration as in FIG. 3 may then alone be used to etch the gate layer 40 to form gate pillars 43. Either process flow described herein are typically used in the production of MOSFETs and may be followed.

Following the patterned photoresist layer 60 stripping process, exposed portions of gate oxide layer 30 are next removed from between gate pillars 43 leaving only gate oxide remaining beneath transistor gate layer 40 in gate pillars 43. The semiconductor MOSFET structure would appear as in FIG. 4 with concave depressions 45 in recesses 41 between gate electrode pillars 43, but with the gate oxide layer 30 absent from between the gate pillars. This will pre-clean and prepare the silicon substrate 20 for a subsequent epitaxial silicon film formation step to rebuild the substrate 20 between the gate pillars 43 and eliminate concave depressions 45.

Any suitable method wet or dry cleaning methods commonly used in the art for substrate pre-cleaning and removing a gate oxide material may be used for removing exposed gate oxide layer 30 between gate pillars 43 and prepare the surface of silicon substrate 20 for forming an epitaxial silicon layer. In some exemplary embodiments, a conventional wet DHF (dilute hydrofluoric acid) etching or cleaning etch process may be used. In other embodiments, a dry etching or cleaning process may be used such as without limitation a plasma-free gas chemical etch system targeted at selective oxide film etching using a Certas machine available from Tokyo Electron Limited (TEL) of Japan, or a SiCoNi etching process using a machine from Applied Materials of Santa Clara, Calif. using HF+NH3 vapor/HF+NH3 plasma to remove the gate oxide.

Preferably prior to deposition of the offset sidewall spacer material and subsequent etching step used to configure and form the vertical sidewall spacers 44 as shown in FIG. 6, a first selective epitaxial silicon film formation step is next performed in a preferred embodiment to rebuild the reduced silicon substrate 20 and gate dielectric layer 30. This step will fill concave depressions 45 to re-establish the original thickness and flat top surface profile of substrate 20 by replenishing material lost in the prior etching and photoresist stripping in FIGS. 3 and 4. Preferably, the epitaxial silicon is grown until the concave depressions 43 between the gate electrode pillars 43 are eliminated, thereby forming a generally flat horizontal surface of an epitaxial silicon film 70 on substrate 20 as shown in FIG. 5. This is important in preventing or minimizing the formation of void defects beneath the source and drains pillars, as further explained herein.

FIG. 5 shows the semiconductor structure 10 created by the first epitaxial silicon film formation or growth. In one embodiment, epitaxial material may be grown by silicon selective epitaxial growth (SEG), which is well known in the art. This silicon SEG process grows a thin silicon film 70 on the silicon substrate 20 which fills in the concave depressions formed between gate pillars 43 that are caused by the prior etching and stripping steps (see, e.g. FIGS. 3 and 4), which may cause the void defect described herein. Preferably, the SEG process forms a substantially flat top surface on silicon film 70 in the bottom of recesses 41 between the gate electrode pillars 43 as shown in FIG. 5. The silicon SEG process generally uses a reactant gas comprising a silicon precursor source material, an inert carrier gas, and optionally a dopant. The silicon SEG process used preferably suppresses the formation of silicon on gate layer 40 which may be made of polysilicon, yet selectively forms silicon film 70 on substrate 20 as shown.

In one exemplary embodiments, the SEG process may use a DCS (dichlorosilane) precursor, HCl etching gas, and H2 carrying gas. The selectivity is achieved by HCl which etch amorphous Si faster than crystal silicon. Exemplary process pressures of 1 to 100 torr at temperatures of 500 C. to 900 C. may be used in some embodiments.

Referring now to FIG. 6, semiconductor structure 10 is shown having offset vertical sidewall spacers 44 formed on the gate pillars 43 and adjacent hard mark 50. Offset vertical sidewall spacers 44 are used to control and define S/D boundary next to gate in order to obtain maximum device performance advantage without production issues. The process of forming sidewall spacers 44 is well known in the art. Beginning with the semiconductor structure shown in FIG. 5, a layer of sidewall spacer material is deposited over the entire structure in FIG. 5 by any suitable method commonly used in the art which preferably completely fill the recesses 41 and covers the top of the gate pillars 43 and hard mask layer 50 thereon. Suitable methods commonly used in the art for depositing the sidewall spacer material includes without limitation chemical vapor deposition (CVD), physical vapor deposition (PVD), and Plasma-Enhanced Chemical Vapor Deposition (PECVD). Other suitable methods may be used.

The sidewall spacer 44 material layer is thereafter etched using a suitable conventional etching process. In one embodiment, sidewall spacer material may be etched using anisotropic dry plasma gas etching having appropriate etching gas chemistry as will be well known to those in the art, examples of which are already described herein including fluorinated gases. In some embodiments, the sidewall spacer material may be, for example without limitation silicon nitride (SiN), (silicon carbide) SiC, silicon oxynitride (SiON), SiCN, BN, SiO2, and SiOCN. The gas chemistry used to etch the sidewall spacer material will be dependent on the material selected for the sidewall spacers. The anisotropic etching steps removes the sidewall spacer material in the recesses 41 between gate pillars 43 and on top of the hard mask layer 50, thereby leaving only material on the vertical sidewalls 42 of the pillars 43 which create the offset sidewall spacers 44 as shown in FIG. 6.

It should be noted that in some embodiments of the MOSFET fabrication process, an oxide layer beneath sidewall spacer 44, which is native oxide, may form on sidewalls 42 of gate pillar 43 when depositing sidewall spacer material that may not be later removed in subsequent processing. A portion of this native oxide may form beneath the vertical sidewall spacers 44 when the spacers are formed as is visible in FIG. 10. In some embodiments, an oxide liner 80 may be intentionally coated on sidewalls 42 before sidewall spacer 44 deposition. If this is the case, the oxide liner may appear as shown in FIG. 11 in gate sidewall 42. The offset sidewall spacers 44 may then be formed as shown in FIG. 6 and processing will continue as described herein.

Referring now to FIG. 7, an etching step is next performed to form source and drain recesses 75 between gate pillars 43 for creating highly doped regions within substrate 20. In one preferred embodiment, source/drain recesses 75 may be formed by a dry etch first to form a recess depth and then followed by a wet etch to form the desired profile. In one exemplary embodiment, dry etching may be performed by using plasma chemistry gas like HBr/Cl2/O2/N2/NF3/SF6/CxFyHz. Wet etch may be performed by using an etchant such as TMAH (Tetramethylammonium hydroxide) with density range from 0.5% to 10% in the temperature of 10 C. to 100 C.) Other suitable dry and/or wet etching processes commonly used and well known in the art may be used for forming recesses 75.

Figure 10:
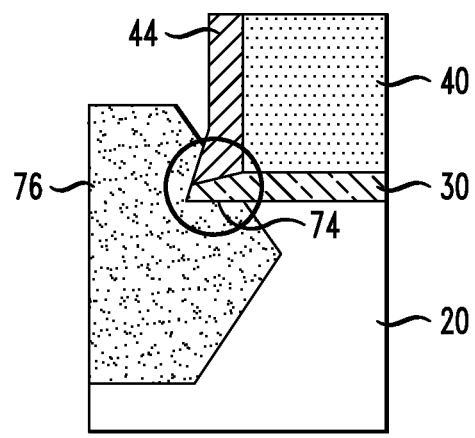
FIG. 10 is a detailed view of a gate electrode formed by the process of FIGS. 2-8.
Figure 11:
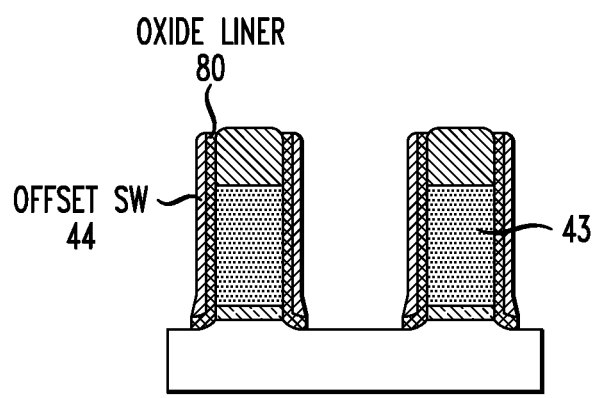
FIG. 11 shows an optional embodiment of a semiconductor device with an oxide sidewall liner.

With respect to FIGS. 7-8 and 10, it should be noted that the underside 74 of the gate oxide layer 30 proximate to lateral sides of the gate electrode pillars is exposed within the source and drain recesses during etching of those recesses. The underside 74 of the gate oxide layer 30 below the gate layer 40 and vertical sidewall spacers 44, and correspondingly the underside of spacers 44 abutting gate oxide layer 30, has a generally flat surface profile with generally square lateral edges and no cavities or beveled recessed corners formed beneath the gate electrode pillars 43. This flat profile is more easily filled in the step in FIG. 8 with epitaxial silicon without formation of the unwanted void defect.

By contrast, the S/D recess etch step in the prior art process shown in FIG. 1 results in downward sloping lateral edges on the oxide layer with beveled cavities being formed at the inside corner in recesses 75 beneath the gate pillars that causes the void defects when subsequently filled with epitaxial silicon (see, e.g. FIG. 9). The underside 74 of gate oxide layer 30 slope downward proximate to gate electrode pillars 43 which forms an acutely angled compound inside corner shape that is difficult to fill with epitaxial silicon as seen in FIG. 9 leaving the void defect.

After formation of source and drain recesses 75, a second epitaxial silicon formation step is performed to preferably completely fill recesses 75 with silicon to form doped source and drain regions 76 as shown in FIG. 8. Any suitable conventional epitaxial silicon process known in the art for forming source/drain regions may be used. The processes preferably need not preferably be selective Si epitaxy so that an overfill of recesses 75 intentionally results in some embodiments. The overfill of gate and drain regions 76 is intentional for contact formation and better current crowding. The overfill is formed by bottom-up gap filling. The doped source and drain regions 76 may be formed in the epitaxial silicon drain regions 76 by dopant ion implantation with P-type or N-type impurities as is well known in the art to form NMOS or PMOS transistors, respectively. Contacts 100 (see, e.g. FIG. 12) may later be formed on doped source/drain regions 76 in a conventional manner.

FIG. 8 and enlarged detail shown in FIG. 10 show semiconductor structure 10 according to the new process. The void defect beneath the lateral edges of the gate pillars 43 and gate oxide 30 are avoided due to the improved flat profile beneath the pillars created by the first selective epitaxial silicon film 70 formation step shown in FIG. 5 and described above. This corrects the profile of the substrate 20 to compensate for the silicon loss caused by the first gate layer (e.g. polysilicon) etching step and photoresist stripping described herein.

By contrast, FIG. 9 shows an enlarged detail of the semiconductor structure formed using the prior art process having the void defect.

Figure 12:
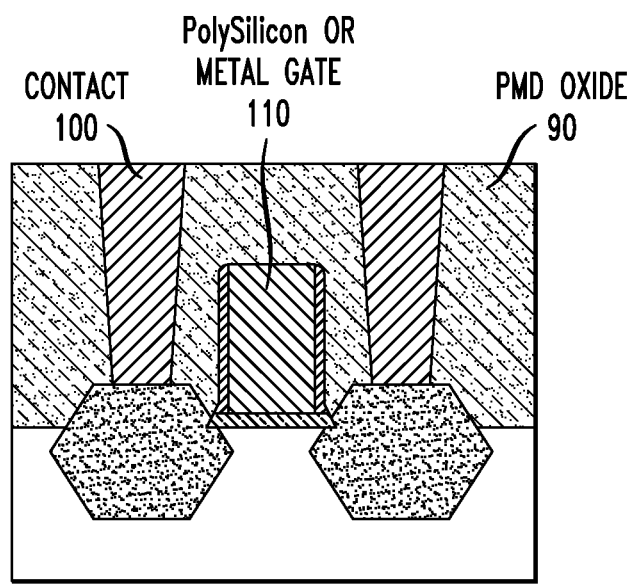
FIG. 12 shows a finished semiconductor device such as MOSFET produced by the process described herein.

Subsequent conventional MOSFET processing steps may subsequently be performed to complete the transistor, including deposition of a pre-metal dielectric (PMD) oxide layer 90 and formation of the drain/source metal contacts 100 formed on source/drain regions 76 to produce a finished device as shown in FIG. 12. Completely formed poly silicon or metal gates 110 are further shown with hard mask layer 50 removed by any suitable conventional means used in the art.

EXAMPLES

Several MOSFET fabrication test process were conducted to compare the following three scenarios: (1) the prior art fabrication process shown in FIG. 1 which experiences silicon loss or void defect formation without benefit of any intermediate selective epitaxial silicon formation step to rebuild the silicon substrate as shown in FIG. 5 according to the present invention; (2) the fabrication process according to the present invention with formation of a 1 nm epitaxial silicon layer 70; and (3) the fabrication process according to the present invention with formation of a 3 nm epitaxial silicon layer 70. The silicon losses were estimated in each of the three test scenarios.

In the prior art process test scenario (1), an estimated silicon loss of 10-12 Angstroms resulted below the gate electrode pillar. In process test scenario (2) according to the present invention, the estimated silicon loss was estimated to be about 0 Angstroms. In process test scenario (3) according to the present invention, an estimated excess of silicon of about 10 Angstroms resulted.

Accordingly, in one embodiment a preferred exemplary non-limiting thickness of an epitaxial silicon film 70 is at least about 1 nm which was effective to fill concave recesses 43 between the gate pillars 43 and eliminate the void defect. Silicon films 70 greater than 1 nm may be used as the test scenario (3) demonstrated that the void defect was avoided albeit an excess of silicon material was formed beneath the gate electrode pillar.

While the foregoing description and drawings represent preferred or exemplary embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. One skilled in the art will further appreciate that the invention may be used with many modifications of structure, arrangement, proportions, sizes, materials, and components and otherwise, used in the practice of the invention, which are particularly adapted to specific environments and operative requirements without departing from the principles of the present invention. In addition, numerous variations in the preferred or exemplary methods and processes described herein may be made without departing from the spirit of the invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A MOSFET semiconductor device comprising:
a plurality of raised gate pillars formed on a substrate, the gate pillars including a gate oxide layer formed on the substrate and a gate layer formed on the gate oxide layer, the gate pillars having vertical sidewalls;
offset vertical sidewall spacers that are provided above the gate oxide layer, the offset vertical sidewall spacers having undersides abutting the gate oxide layer, wherein the offset vertical sidewall spacers are covering the vertical sidewalls of the gate pillars;
doped epitaxial silicon source and drain regions formed between the gates in the substrate;
a pre-metal dielectric layer formed on the substrate between the raised gates and covering the substrate; and
conductive contacts formed on the source and drain regions;
wherein lateral side portions of the gate pillars are embedded in the source and drain regions and underside of the gate oxide layer below the gate layer and the offset vertical sidewall spacers has a flat surface profile, and correspondingly the undersides of the offset vertical sidewall spacers abutting the gate oxide layer have a flat surface profile,
wherein the epitaxial silicon source and drain regions are substantially free of voids beneath the gate oxide layer.

2. The device of claim 1, wherein the offset vertical sidewall spacers are formed of a material selected from SiN, SiC, SiON, SiCN, BN, $SiO_2$, and SiOCN.

3. The device of claim 1, further comprising an oxide liner formed in between the offset vertical sidewall spacers and the lateral side portions of the gate pillars.

4. The device of claim 1, wherein the gate oxide layer is silicon dioxide.

5. The device of claim 4, wherein the gate oxide layer has a thickness of 10 to 100Å.

6. The device of claim 1, wherein the gate layer is a doped or undoped polysilicon layer, metal-containing layer, or a combination thereof.

7. The device of claim 1, wherein the gate layer is polysilicon.

8. The device of claim 7, wherein the gate layer has a thickness of 300 to 2000Å.

9. The device of claim 1, wherein the gate layer is doped with phosphorous.

10. The device of claim 1, wherein the gate layer is doped with boron.

11. The device of claim 1, wherein the gate layer is aluminum, highly doped silicon, refractory metal, a silicide, or multiple layers of the foregoing.

12. The device of claim 1, wherein the gate layer is a silicide such as TiSi, MoSi, TaSi, or WSi.

13. The device of claim 1, wherein the gate layer is tungsten.

* * * * *